(12) United States Patent
Kang (10) Patent No.: US 7,760,579 B2
(45) Date of Patent: Jul. 20, 2010

(54) FLASH MEMORY DEVICE AND BLOCK SELECTION CIRCUIT THEREOF

(75) Inventor: Young Su Kang, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 23 days.

(21) Appl. No.: 12/134,141

(22) Filed: Jun. 5, 2008

(65) Prior Publication Data
US 2009/0244975 A1    Oct. 1, 2009

(30) Foreign Application Priority Data
Mar. 28, 2008   (KR) ................. 10-2008-0028863

(51) Int. Cl.
*G11C 8/00* (2006.01)
(52) U.S. Cl. ................ 365/230.03; 365/185.11; 365/203; 365/230.06; 365/185.05; 365/189.08
(58) Field of Classification Search ............ 365/230.03, 365/185.11, 203, 230.06, 185.05, 189.08
See application file for complete search history.

(56) References Cited

U.S. PATENT DOCUMENTS 7,161,842 B2 *   1/2007   Park ...................... 365/185.33
7,180,786 B2 *   2/2007   Mastrangelo et al. .. 365/185.23
7,200,039 B2 *   4/2007   Lee ....................... 365/185.18
2001/0005015 A1 *   6/2001   Futatsuyama et al. .......... 257/1

FOREIGN PATENT DOCUMENTS

KR   1020050022277 A   3/2005
KR   1020050097595 A   10/2005

* cited by examiner

*Primary Examiner*—Son Dinh
(74) *Attorney, Agent, or Firm*—Townsend and Townsend and Crew LLP (57) ABSTRACT

The present invention relates to a block selection circuit of a flash memory device. The block selection circuit includes a control signal output unit, switching means, and an operation controller. The control signal output unit outputs a control signal for enabling or disabling memory blocks connected thereto by employing block address signals. The block address signals are decoded according to an input address and provided. The switching means switches the control signal so that the control signal is input as a block selection control signal. The operation controller turns off drain and source select transistors of a memory block connected thereto according to a logic level of a first control signal.

16 Claims, 6 Drawing Sheets

FLASH MEMORY DEVICE AND BLOCK SELECTION CIRCUIT THEREOF

CROSS-REFERENCES TO RELATED APPLICATIONS

The present application claims priority to Korean patent application number 10-2008-0028863, filed on Mar. 28, 2008, which is incorporated by reference in its entirety.

BACKGROUND OF THE INVENTION

The present invention relates to flash memory devices.

In a flash memory device, a bad block refers to a block that could not be repaired although column repair was performed on the block. The number of bad blocks generally needs to be no more than 2% of the total blocks.

A bad block is detected at the time of a wafer test in the manufacturing process of a flash memory device. A memory block that is determined to be a bad block is disabled in hardware by cutting a block fuse in the middle of a path that enables a corresponding block. The block fuse, when cut, makes it impossible to enable the word line of a block, thus disabling an operation of the corresponding block.

Figure 1:
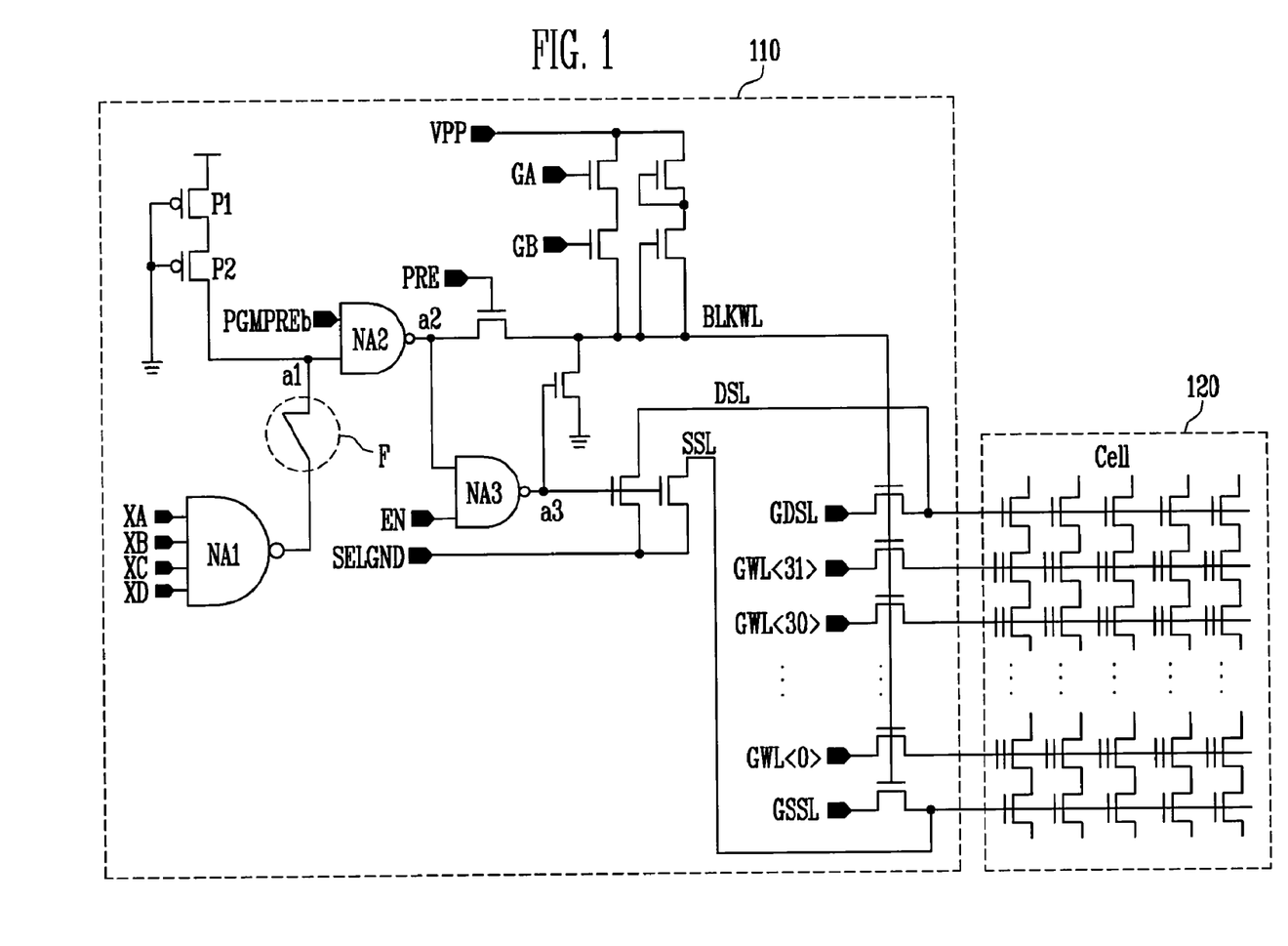
FIG. 1 is a circuit diagram showing a memory block selection circuit.

FIG. 1 is a circuit diagram showing a block selection circuit employing a conventional block fuse. This drawing shows a part of a block selection circuit that outputs a block enable signal. A block selection circuit 110 selects a memory block 120 of a flash memory device. The block selection circuit 110 includes first to third NAND gates NA1 to NA3 and a fuse F. The block selection circuit 110 is generally included in an X decoder of a flash memory device.

The first NAND gate NA1 outputs input block addresses XA, XB, XC, and XD to a node a1. The block addresses XA, XB, XC, and XD are block addresses that are decoded using a row address. The row address is input together with a program or read operation command of a flash memory device.

The fuse F is connected between the first NAND gate NA1 and the node a1.

The output of the first NAND gate NA1 is decided by the block addresses XA, XB, XC, and XD (hereinafter, referred to as "XABCD"). When the block address XABCD is a high level, the first NAND gate NA1 outputs a low-level signal, thus making the node a1 a low level. Further, a control signal PGMPREb of a low level is input to the second NAND gate NA2, which in turn outputs a low-level signal. Accordingly, an enable signal is input to a block corresponding to the block address XABCD.

This block selection circuit is connected to each block. The block selection circuit is adapted to not input an enable signal to a block which is recognized as a bad block. The fuse F is cut for a bad block.

Further, the second NAND gate NA2 logically combines a signal level of the node a1 and the program control signal PGMPREb and outputs a result to a node a2. The third NAND gate NA3 logically combines a logic level of the node a2 and an enable signal EN and outputs a result to the node a3. The memory block 120 is selected according to the logic levels of node a2 and node a3.

Figure 2:
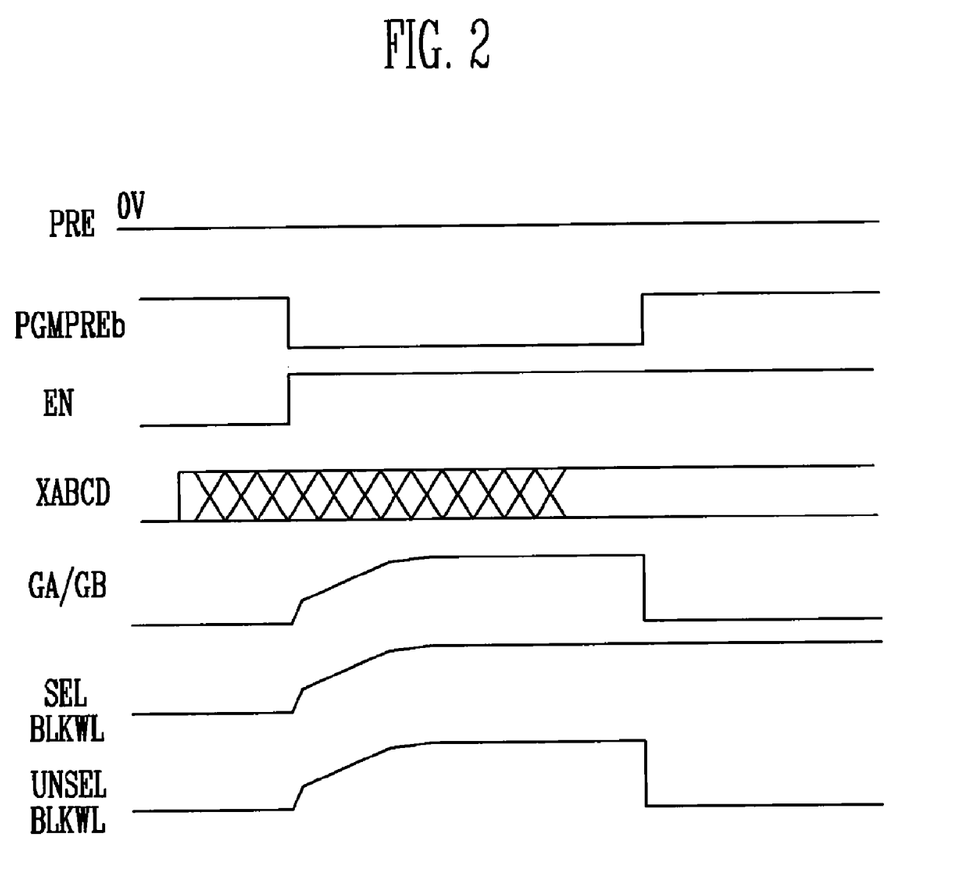
FIG. 2 is an operation timing diagram of the circuit shown in FIG. 1.

FIG. 2 is a timing diagram of the circuit shown in FIG. 1. At a time when the program control signal PGMPREb of a low level and the enable signal EN of a high level are applied, the block address signal XABCD is input to the first NAND gate NA1.

Thus, a signal BLKWL to select a block is precharged to a high level. If a block is processed as a bad block and the fuse F is cut, the signal BLKWL shifts to a low level when the program control signal PGMPREb shifts to a high level. Consequently, a corresponding memory block 120 is disabled.

The block selection circuit 110 is an important element for the operation of a flash memory device. However, in order to reduce the size of a flash memory device, it would be desirable to reduce the size of the block selection circuit 110.

BRIEF SUMMARY OF THE INVENTION

The present invention relates to a flash memory device and a block selection circuit thereof, which can reduce the area occupied by the block selection circuit by reducing the number of transistors used in the circuit.

A flash memory device according to an aspect of the present invention includes a memory cell block in which a plurality of memory cells, a drain select transistor, and a source select transistor are connected in a string structure, a controller including an address counter, wherein the address counter generates and outputs a block address signal in response to an input address signal in order to select the memory cell block, and a block selection circuit which controls the drain and source select transistors in response to the block address signal and enables or disables the memory cell block.

The block selection circuit can include a control signal output unit for outputting a control signal for enabling or disabling memory blocks connected thereto by employing block address signals, the block address signals being decoded according to an input address and provided, an operation controller for turning off drain and source select transistors of a memory block connected thereto according to a logic level of the control signal, and switching means for switching the control signal so that the control signal is input to the operation controller as a block selection control signal.

The control signal output unit can include logic combination means for logically combining the block address signals and outputting a combined signal, and inversion means for inverting an output signal of the logic combination means and outputting an inverted signal as the control signal.

The switching means can be operated according to a precharge control signal.

The operation controller can be operated according to the output signal of the logic combination means.

A flash memory device according to another aspect of the present invention includes a control signal output unit for outputting a control signal for enabling or disabling memory blocks connected thereto by employing block address signals, the block address signals being decoded according to an input address and provided, an operation controller for turning off drain and source select transistors of a memory block connected thereto according to a logic level of the control signal, and switching means for switching the control signal so that the control signal is input to the operation controller as a block selection control signal.

The control signal output unit can include logic combination means for logically combining the block address signals and outputting a combined signal, and inversion means for inverting an output signal of the logic combination means and outputting an inverted signal as the control signal.

The switching means can be operated according to a precharge control signal.

The operation controller can be operated according to the output signal of the logic combination means.

DESCRIPTION OF SPECIFIC EMBODIMENTS

A specific embodiment according to the present invention will be described with reference to the accompanying drawings. However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

Figure 3A:
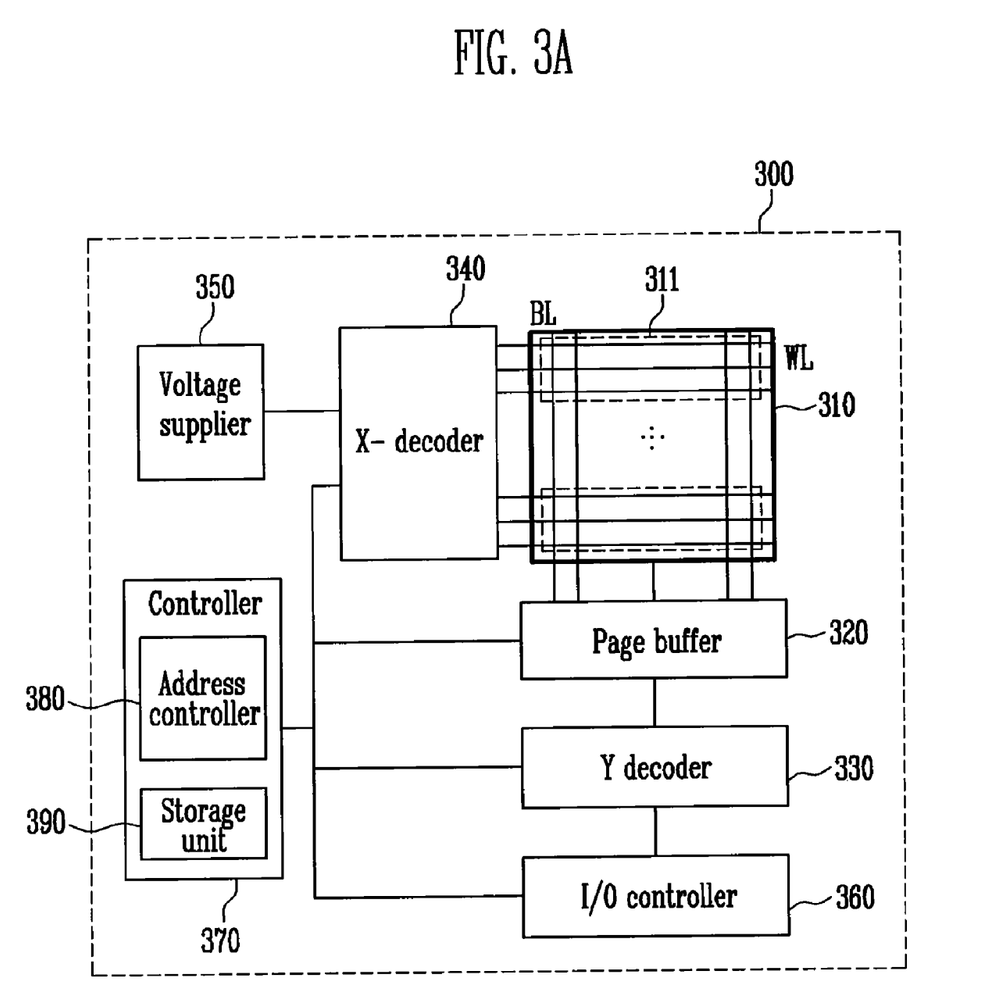
FIG. 3A is a block diagram of a flash memory device according to an embodiment of the present invention.

FIG. 3A is a block diagram of a flash memory device according to an embodiment of the present invention. A flash memory device 300 includes a memory cell array 310, a page buffer 320, a Y decoder 330, an X decoder 340, a voltage supplier 350, an I/O controller 360, and a controller 370.

The memory cell array 310 comprises of memory cells for data storage. The page buffer 320 includes page buffer circuits for latching data to be programmed into a memory cell or reading data from a memory cell. The Y decoder 330 provides a path between the page buffer 320 and the I/O controller 360. The I/O controller 360 inputs or outputs data to or from the page buffer 320 through the Y decoder 330, or transfers external input commands and addresses to the controller 370. The X decoder 340 selects a memory cell block of the memory cell array 310 according to a control signal output by the controller 370. The voltage supplier 350 generates and supplies voltages for an operation. The controller 370 controls an overall operation of the flash memory device 300.

The controller 370 includes an address controller 380 and a storage unit 390. The address controller 380 outputs an address control signal by employing an address input through the I/O controller 360. The storage unit 390 stores algorithm information, administrative information needed to operate the flash memory device 300, bad block information, and so on.

The memory cell array 310 has a plurality of memory blocks 311. Each block has a plurality of memory cells defined by word lines WL and bit lines BL. Each block typically has a plurality of memory cells connected in series, where one end is connected to a drain select transistor and the other end is connected to a source select transistor. Each page buffer circuit of the page buffer 320 is connected to a pair of bit lines in the present embodiment. The Y decoder 330 and the X decoder 340 select a page buffer circuits based on an input address in response to the address control signal output by the address controller 380, or select a word line of the memory cell array 310.

In particular, the X decoder 340 includes a block selection circuit for selecting the memory blocks 311 of the memory cell array 310 in response to the address control signal of the address controller 380. The X decoder 340 selects the word line WL of a selected memory block 311 and connects the selected word line to the voltage supplier 350 so that voltages supplied from the voltage supplier 350 are supplied to the selected word line.

The controller 370 outputs a control signal for controlling an operation of each function block according to a program algorithm of the storage unit 390. Further, the address controller 380 of the controller 370 provides the address control signal to the Y decoder 330 and the X decoder 340 based on addresses input through the I/O controller 360.

The address controller 380 decodes a row address, input through the I/O controller 360, and outputs a decoded result as block addresses XA, XB, XC, and XD (hereinafter, referred to as "XABCD"), thereby enabling or disabling the memory block 311. Information on the memory blocks 311 that are bad blocks is stored in the storage unit 390 of the controller 370. The address controller 380 generates the block address signal XABCD based on bad block information, stored in the storage unit 390, and provides a generated signal to the X decoder 340.

Figure 3B:
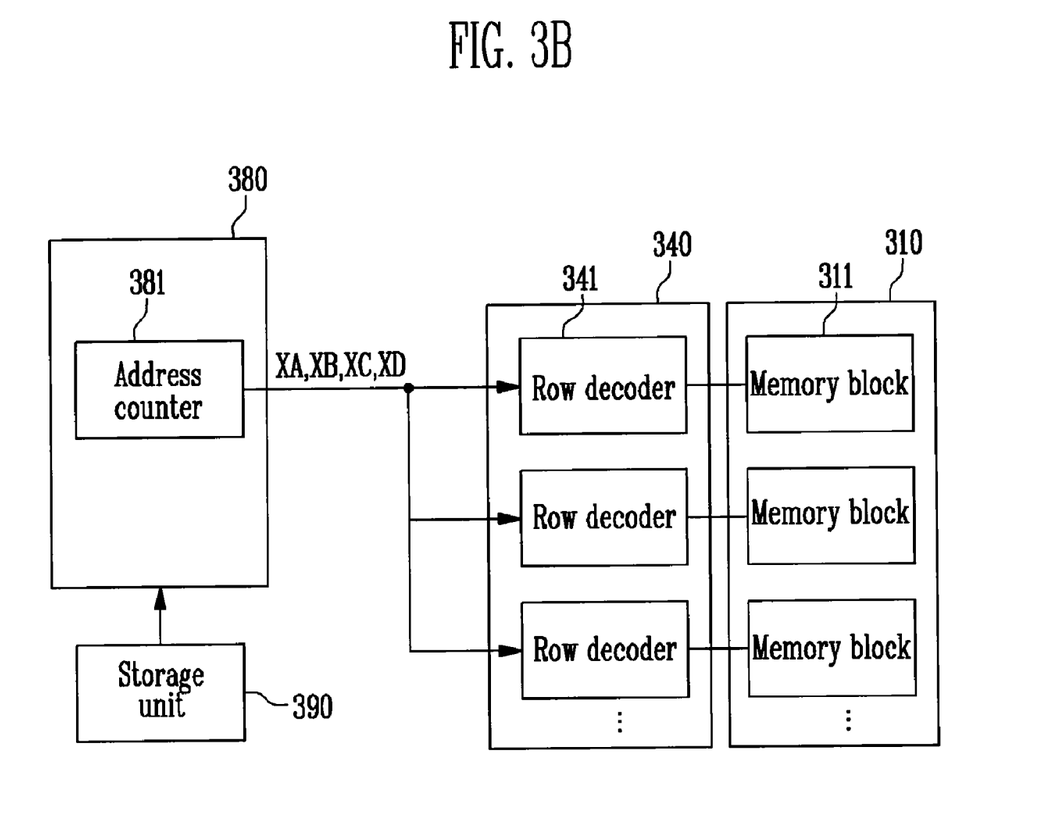
FIG. 3B is a partial block diagram of a flash memory device for selecting a memory block of FIG. 3A.

FIG. 3B is a partial block diagram of a flash memory device for selecting a memory block according to one embodiment of the present invention. The address controller 380 decodes an input address and outputs the memory block address signal XABCD. The address controller 380 includes an address counter 381. The address counter 381 generates and outputs the block address signal XABCD based on bad block information provided from the storage unit 390. The X decoder 340 includes row decoders 341. The row decoder 341 is connected to the memory block 311 of the memory cell array 310 and enables or disables the memory block.

The address counter 381 decodes address information input from the I/O controller 360 and outputs a decoded result to the row decoders 341 of the X decoder 340 as a block address signal. At this time, the address counter 381 controls the enabling or disabling of the block address signal with reference to bad block information stored in the storage unit 390. That is, a block address signal of a bad block is transmitted as a disable signal.

Figure 3C:
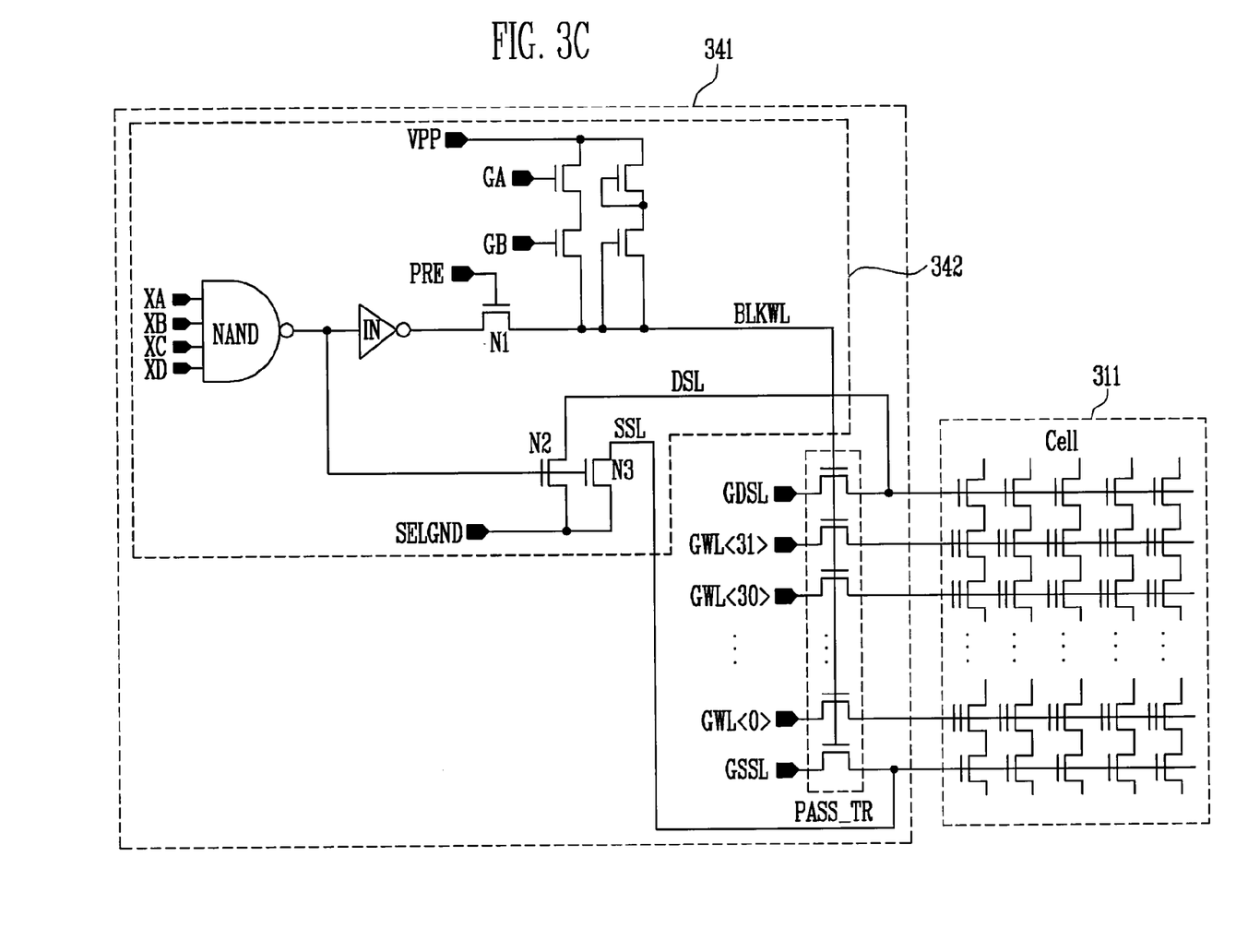
FIG. 3C is a detailed partial circuit diagram of the block shown in FIG. 3B.

The row decoder 341 includes a block selection circuit 342 (see FIG. 3C). The block selection circuit 342 controls the enabling or disabling of the memory block 311 connected thereto according to a block address signal provided by the address controller 380.

The row decoder 341 is described below in more detail. FIG. 3C is a detailed partial circuit diagram of the block shown in FIG. 3B. The block selection circuit 342 of the row decoder 341 is connected to the memory block 311 and is configured to control the enabling or disabling of a corresponding memory block 311. The block selection circuit includes a first NAND gate NAND, a first inverter IN, and first to third NMOS transistors N1 to N3.

The first NAND gate NAND performs a NAND operation on the block address signal XABCD (or select signal) received from the address counter 381 and outputs a result (or a output logic signal) thereof. The first inverter IN inverts the output of the first NAND gate NAND and outputs an inverted result.

A signal output from the first inverter IN is output as the block select signal BLKWL through the first NMOS transistor N1. The first NMOS transistor N1 is turned on in response to a control signal PRE and transfers the output signal of the first inverter IN as the block select signal BLKWL.

The block select signal BLKWL is input to the gates of pass transistors PASS_TR, which are turned on in response thereto. The pass transistors PASS_TR are provided between global word lines GWL for supplying an operating voltage to the word lines of the memory block 311 and the word lines of the memory block 311.

The output signal of the first NAND gate NAND is also input to the gates of the second and third NMOS transistors N2, N3. The second NMOS transistor N2 is provided between a ground node and a drain select line DSL. The third NMOS transistor N3 is provided and between the ground node and a source select line SSL.

Thus, when the first NAND gate NAND outputs a high-level signal, the second and third NMOS transistors N2, N3 are turned on. The drain select line and the source select line become connected to the ground node. Accordingly, a drain select transistor and a source select transistor are turned off. Therefore, the memory block 311 is disabled or enabled according to the logic level of an output signal of the first NAND gate NAND.

The first NMOS transistor N1 functions to switch the output of the first inverter IN1 as the block select signal BLKWL. The second and third NMOS transistors N2, N3 control the operation of the drain select transistor and the source select transistor of the memory block.

The block selection circuit according to an embodiment of the present invention is configured to output a block select signal using a less number of logic gates, e.g., one NAND gate and one inverter, than the conventional block selection circuit. Accordingly, the area used for the block selection circuit can be reduced. In addition, an inverter occupies a significantly less area than a NAND gate and is simpler to manufacture.

Figure 4:
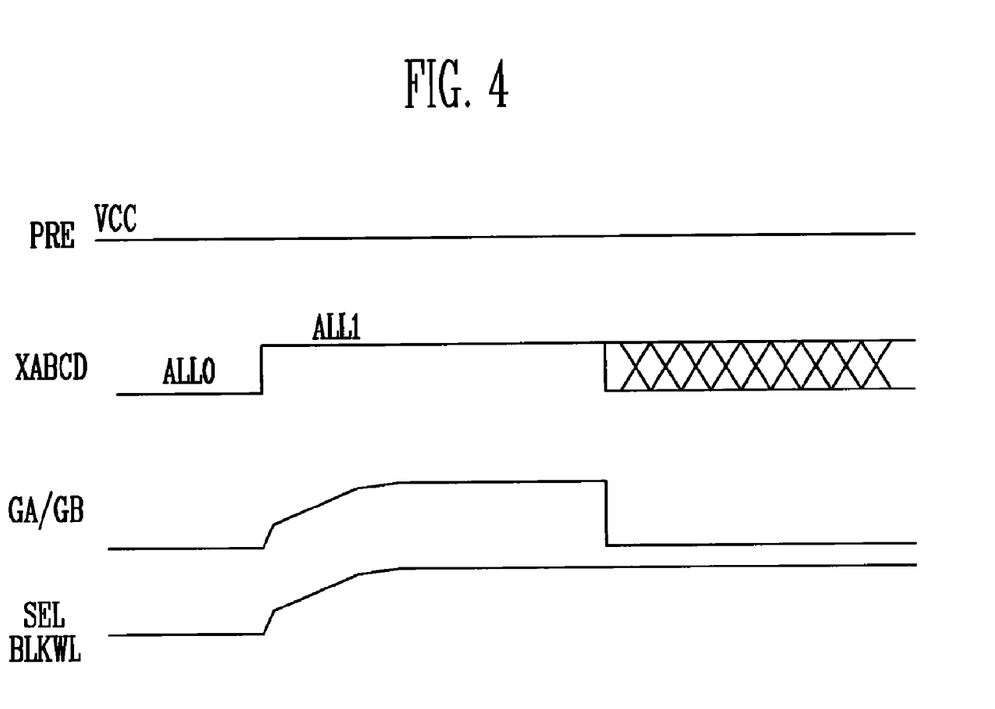
FIG. 4 is an operation timing diagram of the circuit shown in FIG. 3C.

The operation of the block selection circuit is described in more detail below with reference to the timing diagram of FIG. 4. FIG. 4 is an operation timing diagram of the block selection circuit shown in FIG. 3C. The control signal PRE of a high level (or Vcc) is continuously input.

The block address signal XABCD is input from the address controller 380. The address controller 380 inputs the entire block address signals XABCD as a high level in order to enable a memory block.

When the entire block address signals XABCD are input as a high level, the first NAND gate NAND outputs a low-level signal. The signal output from the first NAND gate NAND is inverted by the first inverter IN and then output as a high-level signal.

If the control signal PRE is a high level, the output signal of the first inverter IN is input to the gates of the pass transistors PASS_TR, so that operation signals, including the global word lines GWL, are connected to the memory block 311. This is similar when the memory block 311 is enabled in the conventional method.

As described above, according to the flash memory device and the block selection circuit thereof in accordance with the present invention, the number of constituent elements constituting the block selection circuit for selecting a memory block can be reduced and therefore the chip size of a flash memory device can be reduced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A flash memory device, comprising:
   a memory cell array having a plurality of memory cell blocks, each memory cell block having a plurality of cell strings, each cell string including a plurality of memory cells, a drain select transistor, and a source select transistor connected in series;
   a controller including an address counter, wherein the address counter outputs a block address signal in response to an input address signal in order to select a memory cell block from the plurality of memory cell blocks in the memory cell array; and
   a block selection circuit including first and second transistors that are used to control the drain and source select transistors in response to the block address signal and enable or disable the memory cell block,
   wherein the first transistor is provided between a drain select line and a ground, and the second transistor is provided between a source select line and a ground.

2. The flash memory device of claim 1, wherein the block selection circuit comprises:
   a control signal output unit configured to output a control signal for enabling or disabling memory blocks connected thereto by employing block address signals; and
   a switching unit configured to switch the control signal so that the control signal is input to the operation controller as a block selection control signal,
   wherein the first and second transistors are controlled by using the control signal output by the control signal output unit.

3. The flash memory device of claim 2, wherein the control signal output unit comprises:
   a logic gate configured to receive the block address signals and output an output signal; and
   an inverter to invert the output signal and transmit an inverted signal as the control signal.

4. The flash memory device of claim 2, wherein the switching unit is operated according to a precharge control signal.

5. The flash memory device of claim 3, wherein gates of the first and second transistors are coupled to a node between the logic gate and the inverter.

6. A block selection circuit comprising:
   a control signal output unit configured to output a control signal for enabling or disabling memory blocks connected thereto by employing block address signals, the block address signals being decoded according to an input address;
   an operation controller configured to turn off drain and source select transistors of a memory block connected thereto according to a logic level of the control signal; and
   a switching unit configured to switch the control signal so that the control signal is input to the operation controller as a block selection control signal.

7. The block selection circuit of claim 6, wherein the control signal output unit comprises:
   a logic gate configured to receive the block address signals and output an output signal; and
   an inverter to invert the output and transmit an inverted signal as the control signal.

8. The block selection circuit of claim 6, wherein the switching unit is operated according to a precharge control signal.

9. The block selection circuit of claim 6, wherein the operation controller is operated according to the output signal of the logic combination means.

10. A flash memory device, comprising:
    a memory cell array having a plurality of memory cell blocks, each memory cell block having a plurality of cell strings, each cell string including a plurality of memory cells, a drain select transistor, and a source select transistor connected in series; and a block selection circuit including a NAND gate, a first control unit, and a second control unit, the block selection circuit being configured to select a memory block in the memory cell array by controlling the drain and source select transistors of the selected memory block in response to a select signal received from a controller, wherein the NAND gate is configured to receive the select signal and output a logic signal that is used to control the first and second control units, the first and second control units being configured to control the drain and source select transistors of the selected memory block.

11. The flash memory device of claim 10, further comprising:

a controller configured to output the select signal in response to an input address signal in order to select the selected memory cell block of the memory cell array.

12. The flash memory device of claim 10, wherein the block selection circuit further comprises:

an inverter configured to receive the logic signal and output an inverted signal, the inverted signal being applied to gates of pass transistors.

13. The flash memory device of claim 11, wherein the first control unit is a first control transistor provided between a drain select line and a ground, and wherein the second control unit is a second control transistor provided between a source select line and a ground, wherein gates of the first and second control transistors are configured to receive the logic signal.

14. The flash memory device of claim 13, the block selection circuit further comprises:

a third control transistor configured to receive the inverted signal and transmit the inverted signal to the pass transistors according to a control signal.

15. The flash memory device of claim 10, wherein the first control unit is a first control transistor provided between a drain select line and a ground, and wherein the second control unit is a second control transistor provided between a source select line and a ground, wherein gates of the first and second control transistors are configured to receive the logic signal.

16. The flash memory device of claim 15, the block selection circuit further comprises:

a third control transistor configured to receive the inverted signal and transmit the inverted signal to the pass transistors according to a control signal.

* * * * *